(12) United States Patent
Sera

(10) Patent No.: US 7,752,516 B2
(45) Date of Patent: Jul. 6, 2010

(54) SEMICONDUCTOR DEVICE AND SCAN TEST METHOD

(75) Inventor: Yoshiaki Sera, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1134 days.

(21) Appl. No.: 11/391,193

(22) Filed: Mar. 29, 2006

(65) Prior Publication Data

US 2006/0225010 A1    Oct. 5, 2006

(30) Foreign Application Priority Data

Mar. 30, 2005    (JP)    ............... 2005-100122

(51) Int. Cl.
*G01R 31/28* (2006.01)

(52) U.S. Cl. .............. 714/731; 714/724; 714/726

(58) Field of Classification Search ............ 714/724, 714/731, 726, 30, 733, 734; 716/4; 365/291.1, 365/233.1, 233.11, 233.12
See application file for complete search history.

(56) References Cited

U.S. PATENT DOCUMENTS

| 4,816,700 | A | * | 3/1989 | Imel | ................. | 327/154 |
| 5,941,990 | A | * | 8/1999 | Hiiragizawa | ............ | 713/310 |
| 6,560,147 | B2 | | 5/2003 | Yoshiyama | | |
| 6,593,786 | B2 | * | 7/2003 | Jung | ................. | 327/158 |
| 6,914,798 | B2 | * | 7/2005 | Kwon et al. | ............ | 365/145 |
| 6,919,745 | B2 | * | 7/2005 | Lee et al. | ............ | 327/149 |

FOREIGN PATENT DOCUMENTS

JP    2002-289776 A    10/2002

* cited by examiner

*Primary Examiner*—Phung M Chung
(74) *Attorney, Agent, or Firm*—Foley & Lardner LLP

(57) ABSTRACT

A semiconductor device includes a clock signal separating circuit and a logic circuit. The clock signal separating circuit separates a clock signal into a first separation clock signal and a second separation clock signal and to supply the second separation clock signal to a test circuit. The logic circuit generates an output clock signal from the first separation clock signal and a first scan clock signal to the test circuit. A second scan clock signal is supplied to the test circuit.

6 Claims, 5 Drawing Sheets

SEMICONDUCTOR DEVICE AND SCAN TEST METHOD

BACKGROUND OF THE INVENTION

1. Field of the Invention

The present invention relates to a semiconductor device having a circuit for separating a clock signal for a delay test.

2. Description of the Related Art

In recent years, a high speed operation is aimed in the semiconductor circuit, and a trouble caused due to a delay has increased. For accurate delay test, it is necessary to set many values to a circuit. Also, in order to accomplish a high trouble detection rate, it is necessary to increase the number of test patterns, namely, to increase a test time. As one method of reducing the number of the patterns in the delay test, a last-shift method is known in which a last clock signal during a shifting operation is used. When this last-shift method is applied to an LSSD (Level-Sensitive Scan Design) method in which a shifting operation is carried out in a two-phase clock signal, there is a problem of skew between pins of a tester. Thus, when the last-shift method is applied to the LSSD method, it is difficult to test a semiconductor device in a high frequency of 100 MHz or more.

As a conventional technique on a scan test, a semiconductor device is known in Japanese Laid Open Patent Publication (JP-P2002-289776A), in which a scan test circuit is installed. This conventional semiconductor device includes a scan test circuit, a clock signal generating circuit and a selector. The scan test circuit has a plurality of flip-flops and has a capture mode and a shift mode. In the capture mode, a plurality of data from an internal circuit are captured into the plurality of flip-flops in parallel in synchronization with a clock signal. In the shift mode, data held by the plurality of flip-flops as a scan chain are shifted in synchronization with the clock signal. The clock signal generating circuit generates a clock signal in synchronization with an external clock signal. The selector receives two clock signals, selects one of the two clock signals in accordance with a scan enable signal for switching between the shift mode and the capture mode, and sends the selected clock signal to clock input terminals of the plurality of flip-flops.

The conventional semiconductor device will be described below with reference to FIG. 1. As shown in FIG. 1, an MUX method in which the shifting operation is carried out in a single-phase clock signal. The conventional semiconductor device is provided with a scan test circuit 1, a selector circuit 2, a clock signal generating circuit 3 and an internal circuit 4 as a scan test target. The operation of the delay test based on the last-shift method is well known, and therefore it will be described briefly. The delay test of the internal circuit 4 is carried out by giving a time difference between a last clock signal in the shift mode and the clock signal in the capture mode to the scan test circuit 1 at the timing of an actual operation. The selector 2 receives a clock signal CLK, a clock signal generated by the clock signal generating circuit 3 and a scan enable signal for switching the scan test circuit 1 to the shift mode or capture mode.

As shown in FIGS. 2A to 2D, by using the clock signal generating circuit 3, it is possible to generate one period Tc of the clock signal in the actual operation shorter than one period Ts of the clock signal used in the shifting operation by the internal circuit 4. In this way, the clock signal is generated in the actual operation speed only during the last-shift operation by the internal circuit 4.

However, in the conventional semiconductor device, the clock signal is made faster by using the internal circuit. Therefore, when the clock signal Tc of a higher rate should be supplied, the frequency of the clock signal Ts in the shift mode is also increased. Thus, the supply of the clock signal of an excessively higher rate results in a problem that the shifting operation becomes impossible. That is, in the conventional example, the test frequency of the delay test is limited by the design.

SUMMARY OF THE INVENTION

In an aspect of the present invention, a semiconductor device includes a clock signal separating circuit configured to separate a clock signal into a first separation clock signal and a second separation clock signal and to supply the second separation clock signal to a test circuit; and a logic circuit configured to generate an output clock signal from the first separation clock signal and a first scan clock signal to the test circuit, wherein a second scan clock signal is supplied to the test circuit.

Here, the test circuit may include a first flip-flop circuit configured to operate in response to the second scan clock signal, the second separation clock signal and an output clock signal of the logic circuit; a second flip-flop circuit configured to operate in response to an output signal of the first flip-flop circuit, the second scan clock signal, the second separation clock signal and the output clock signal of the logic circuit; an internal circuit as a test object configured to operate based on an output signal of the second flip-flop circuit; and a third flip-flop circuit configured to operate in response to an output signal of the internal circuit, the second scan clock signal, the second separation clock signal and the output clock signal of the logic circuit.

Also, the logic circuit may include an AND circuit configured to output the output clock signal as a logical product of the first separation clock signal and the first scan clock signal.

Also, the clock signal separating circuit may sequentially separate the first separation clock signal and the second separation clock signal from the clock signal in response to each of falling edges of the clock signal.

Also, the clock signal separating circuit may include an inverter configured to invert the clock signal; a fourth flip-flop circuit configured to operate in response to an output clock signal of the inverter, its own first output clock signal and a reset signal; a fifth flip-flop circuit configured to operate in response to the clock signal, its own first output clock signal and the reset signal; a first NAND circuit configured to operate in response to a first output clock signal of the fourth flip-flop circuit and a first output clock signal of the fifth flip-flop and to output the first separation clock signal; and a second NAND circuit configured to operate in response to a second output clock signal of the fourth flip-flop circuit and a second output clock signal of the fifth flip-flop circuit and to output a second separation clock signal.

Also, a scan test is carried out to the semiconductor device. In a first shift mode of the scan test, the first, second and third flip-flop circuits carry out a shifting operation. In a second shift mode of the scan test, the first, second and third flip-flop circuits do not carry out the shifting operation. In a capture mode, a data is taken in the third flip-flop circuit. In a third shift mode, the first, second and third flip-flop circuits carry out the shifting operation.

In another aspect of the present invention, a method of carrying out a delay test of a semiconductor device, is achieved by providing a scan test path which includes a flip-flop circuits and an internal circuit as a test target; by carrying out a shifting operation in the scan test path in a first shift mode; by supplying an external clock signal in a second shift mode; by taking a data in the scan test path in a capture mode by using a part of the external clock signal; and by carrying out a shifting operation in the scan test path in a third shift mode.

Here, the part of the external clock signal may be determined externally.

Also, the scan test path may carry out the shifting operation in response to both of first and second scan clock signals. The taking is achieved by separating the external clock signal into a first separation clock signal and a second separation clock signal; by calculating a logical product of the first separation signal and the second scan clock signal to output to the scan test path; and by supplying the second separation signal as the part of the external clock signal to the scan test path.

In still another aspect of the present invention, a semiconductor device having a scan path test circuit, includes a scan path flip-flop configured to carry out a shift mode operation in response to a 2-phase clock signal of a master clock signal and a slave clock signal and a capture mode operation in response to a system clock signal; and a separating circuit configured to separate an external clock signal into the slave clock signal and the system clock signal.

DESCRIPTION OF THE PREFERRED EMBODIMENTS

Hereinafter, a semiconductor device of the present invention will be described in detail with reference to the attached drawings.

Figure 1:
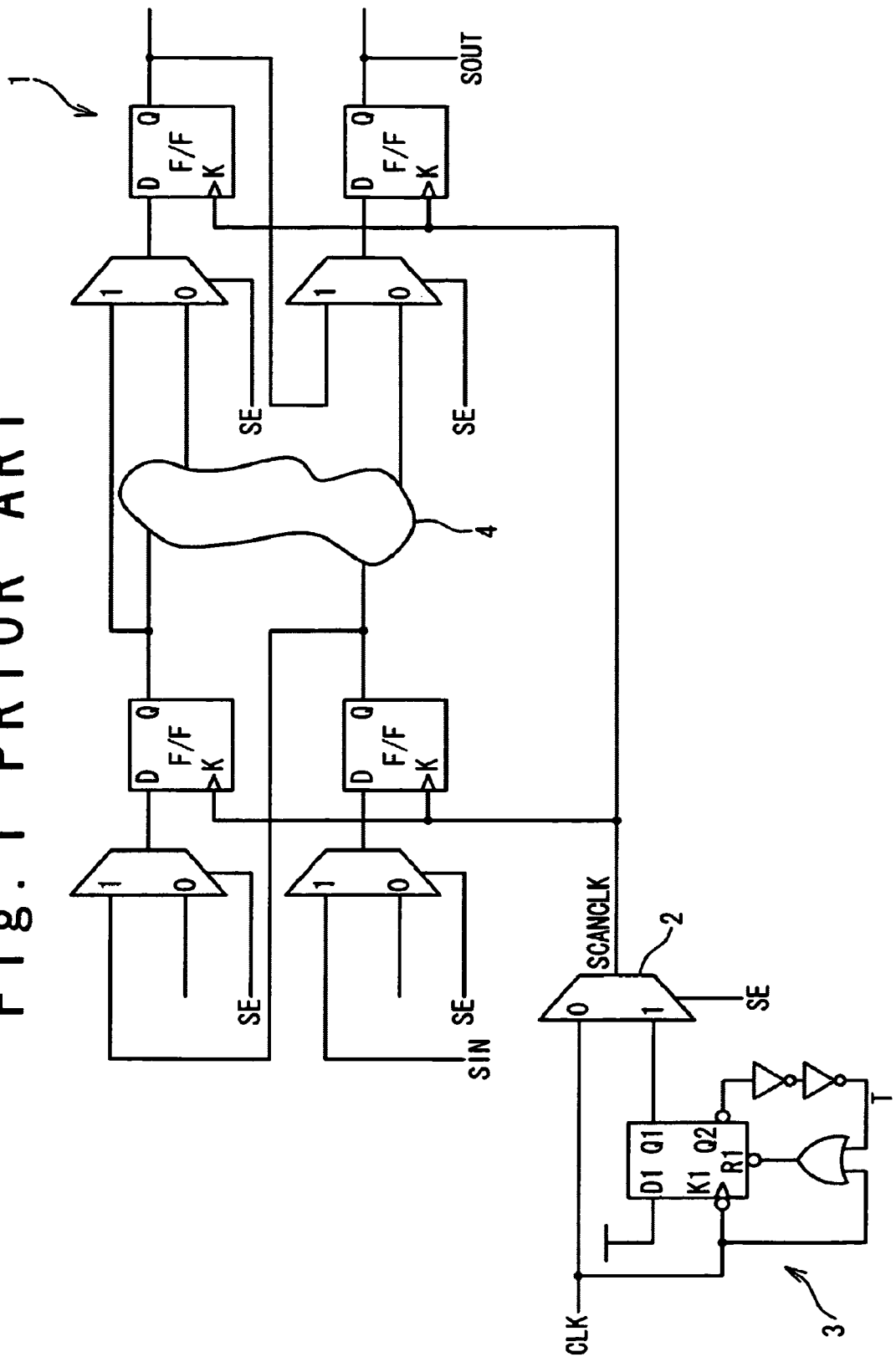
FIG. 1 is a circuit diagram showing a part of a conventional scan test circuit of a semiconductor device.
Figures 2A, 2B, 2C, 2D:
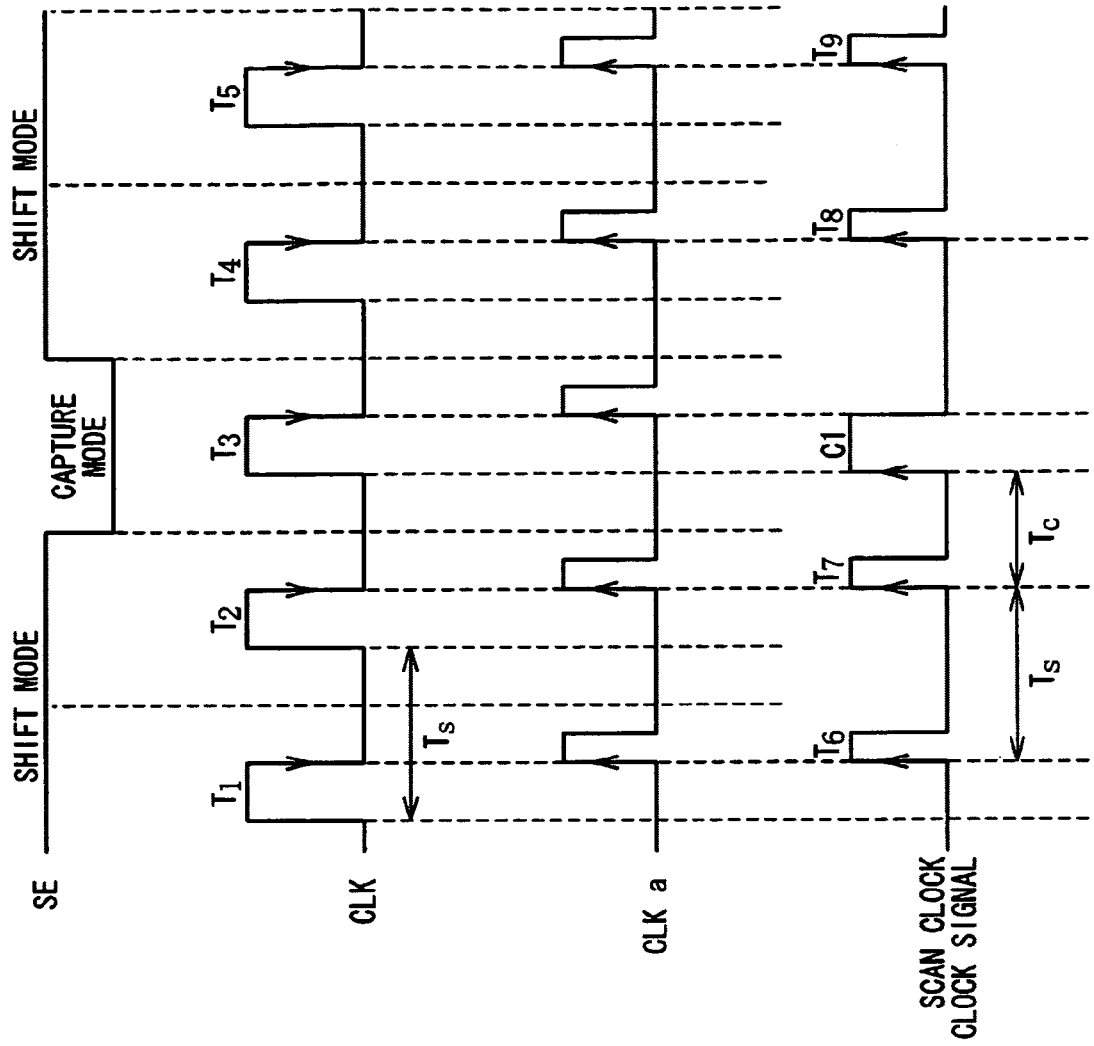
FIGS. 2A to 2D are timing charts of signals used in the conventional scan test circuit.
Figure 3:
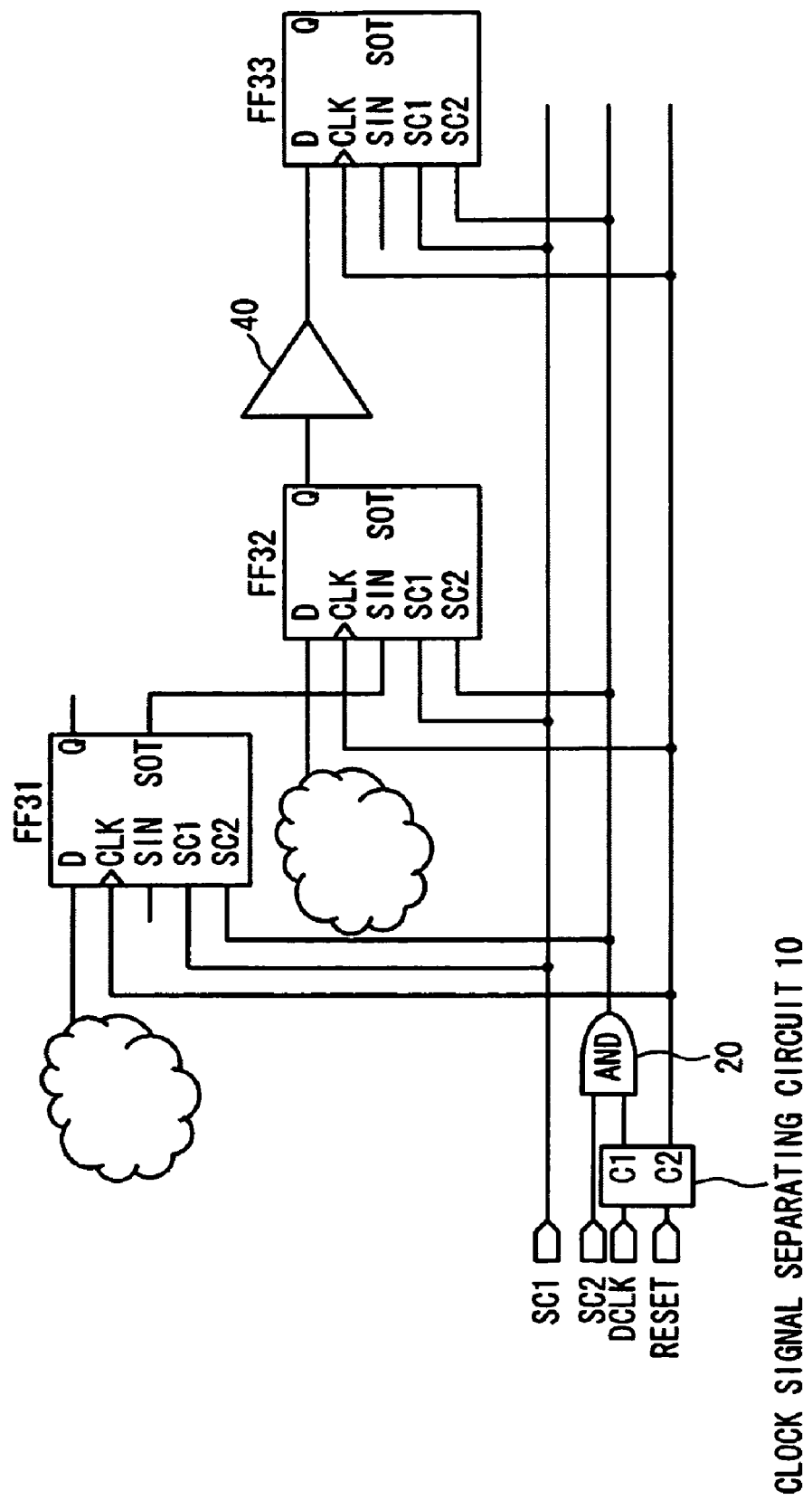
FIG. 3 is a circuit diagram showing a part of a scanning circuit for delay test in a semiconductor device according to an embodiment of the present invention.

FIG. 3 is a block diagram showing a part of the semiconductor device according to an embodiment of the present invention. Referring to FIG. 3, a delay test circuit in the semiconductor device according to the embodiment of the present invention includes a clock separating circuit 10, an AND circuit 20, a scan test circuit and an internal circuit 40 that is a scan test target. The semiconductor device in the embodiment has two scan clock terminals SC1 and SC2 for a two-phase clock signal, and a clock signal DCLK from the DCLK terminal as a delay test terminal, and a control signal RESET from a RESET terminal as a reset signal terminal. The two scan clock terminals SC1 and SC2 may be master and slave clock signals.

The clock signal separating circuit 10 receives a clock signal from the DCLK terminal, separates the clock signal into odd-numbered components and even-numbered components and outputs the odd-numbered components from a C1 output terminal and the even-numbered components from a C2 output terminal. Also, the clock signal separating circuit 10 receives a reset signal from the RESET terminal. The AND circuit 20 receives a signal SC2 on the SC2 terminal and a signal C1 from the C1 output terminal and outputs an output clock signal as a logical product signal of them. The scan test circuit includes a set of flip-flop circuits (FF31, FF32 and FF33). The flip-flop circuit has a data input terminal (D), a clock signal input terminal (CLK), a serial-in terminal (SIN), the SC1 terminal and the SC2 terminal as the input terminals. Also, the flip-flop circuit has a data output terminal (Q) and a serial-out terminal (SOT) as output terminals. It should be noted that the each of the flip-flop circuits (FF31, FF32 and FF33) takes data therein at a rising edge of the clock signal. The internal circuit 40 as the scan test target is arranged between the data output terminal (Q) of the flip-flop circuit FF32 and the data input terminal (D) of the flip-flop circuit FF33.

In the flip-flop circuit FF31, a signal is sent from the SC1 external terminal to the SC1 terminal of the flip-flop circuit FF31, and the output clock signal from the AND circuit 20 is sent to the SC2 terminal of the flip-flop circuit FF31. Also, an output clock signal from the C2 output terminal of the clock signal separating circuit 10 is sent to the CLK terminal of the flip-flop circuit FF31.

In the flip-flop circuit FF32, a signal outputted from the serial-out terminal (SOT) of the flip-flop circuit FF31 is sent to the serial-in terminal (SIN) of the flip-flop circuit FF32. Also, similarly to the flip-flop circuit FF31, the signal is sent from the SC1 external terminal to the SC1 terminal of the flip-flop circuit FF32, and the output clock signal of the AND circuit 20 is sent to the SC2 terminal of the flip-flop circuit FF32. The output clock signal of the C2 output terminal of the clock signal separating circuit 10 is sent to the CLK terminal of the flip-flop circuit FF32. Moreover, the signal outputted from the data output terminal (Q) of the flip-flop circuit FF32 is sent to the internal circuit 40 of the scan test target.

In the flip-flop circuit FF33, the signal outputted from the internal circuit 40 of the scan test target is sent to the data input terminal (D) of the flip-flop circuit FF33. Also, similarly to the flip-flop circuit FF31 and the flip-flop circuit FF32, the scan clock signal is sent to the SC1 terminal of the flip-flop circuit FF33 from the SC1 external terminal, and the output clock signal of the AND circuit 20 is sent to the SC2 terminal of the flip-flop circuit FF33. The output clock signal of the C2 output terminal of the clock signal separating circuit 10 is sent as the clock signal to the CLK terminal of the flip-flop circuit FF33.

FIGS. 4A to 4E are clock timing charts showing the operation of the present invention.

Figure 4:
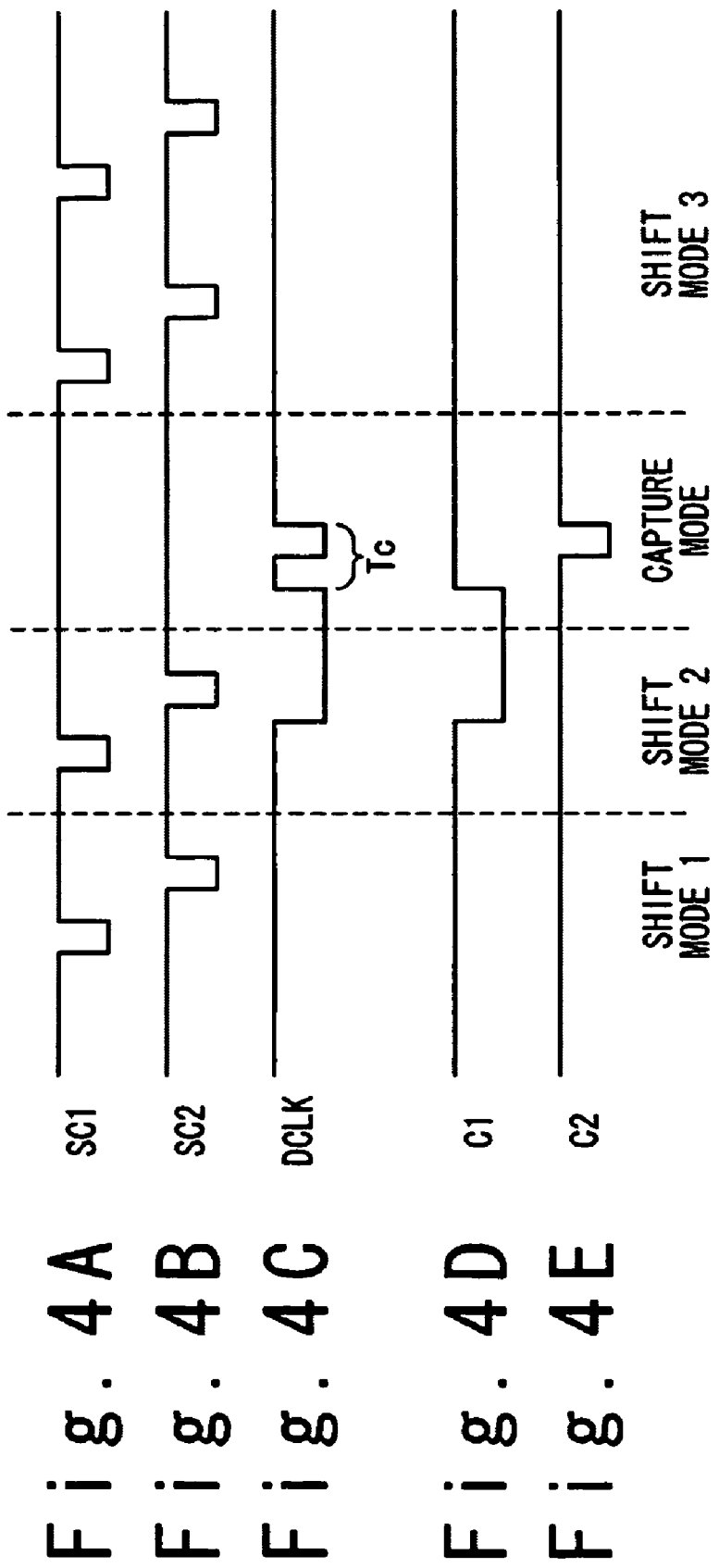
FIGS. 4A to 4E are timing charts showing signals SC1, SC2, DCLK, C1 and C2, respectively.

The scan clock signal SC1 shown in FIG. 4A, the scan clock signal SC2 shown in FIG. 4B and the clock signal DCLK shown in FIG. 4C are the input clock signals supplied to the SC1 external terminal, the SC2 external terminal and the DCLK external terminal, respectively. The clock signal C1 shown in FIG. 4D and the clock signal C2 shown in FIG. 4E are the output clock signals from the C1 output terminal and the C2 output terminal in the clock signal separating circuit 10 in FIG. 3, respectively.

The scan test mode is roughly divided into the shift mode and the capture mode, as described above. In this example, the usual shift mode is further separated into three modes, namely, a shift mode 1, a shift mode 3, and a shift mode 2 that is a shift mode just prior to the capture mode. It should be noted that the modes in the scan test are switched in the order of the shift mode 1, the shift mode 2, the capture mode and the shift mode 3.

In the shift mode 1, the scan clock signals SC1 and SC2 are sequentially and alternately sent, so that the shifting operation is carried out in the scan flip-flops (the scan test circuit 30). At that time, a signal of a high level is outputted from the C1 output terminal of the CLK separating circuit 10, and a signal of the high level is also outputted from the C2 output terminal. Here, a positive logic is used. However, a negative logic may be used.

In the shift mode 2, the scan clock signal SC1 is similarly sent. However, before the scan clock signal SC2 falls (although there is no problem even after the falling edge), the clock signal DCLK is switched from the high level to the low level. Consequently, the clock signal C1 is switched from the high level to the low level in the C1 output terminal of the clock signal separating circuit 10. As a result, the scan clock signal SC2 is only changed and fixed from the high level to the low level in the shift mode 2. Thus, in the shift mode 2, since the active scan clock signals SC1 and SC2 are given, the shifting operation is not carried. That is, the shift mode 2 is a mode for a preparation of the capture mode.

In the capture mode, as shown in FIG. 4C, the clock signal DCLK is switched in the order of the low level, the high level, the low level and the high level. The period Tc is equivalent to the actual operation test time. Then, by changing the period Tc, it is possible to easily change a test frequency. As shown in FIGS. 4D and 4E, the clock signal DCLK is separated in the clock signals C1 and C2 by the clock signal separating circuit 10. For example, the first low level state in the clock signal DCLK is separated into the clock signal C1, and the second low level state is separated into the clock signal C2. At this time, the scan clock signals SC1 and SC2 are fixed to the high level.

After the capture mode, the shift mode 3 is carried out. However, since the clock signal DCLK is fixed to the high level, the clock signals C1 and C2 in the high level are outputted from the C1 output terminal and the C2 output terminal in the clock signal separating circuit 10. After that, the scan clock signals SC1 and SC2 are sequentially and alternately outputted so that the shifting operation is carried out in the flip-flop circuits FF31, FF32 and FF33.

Figure 5:
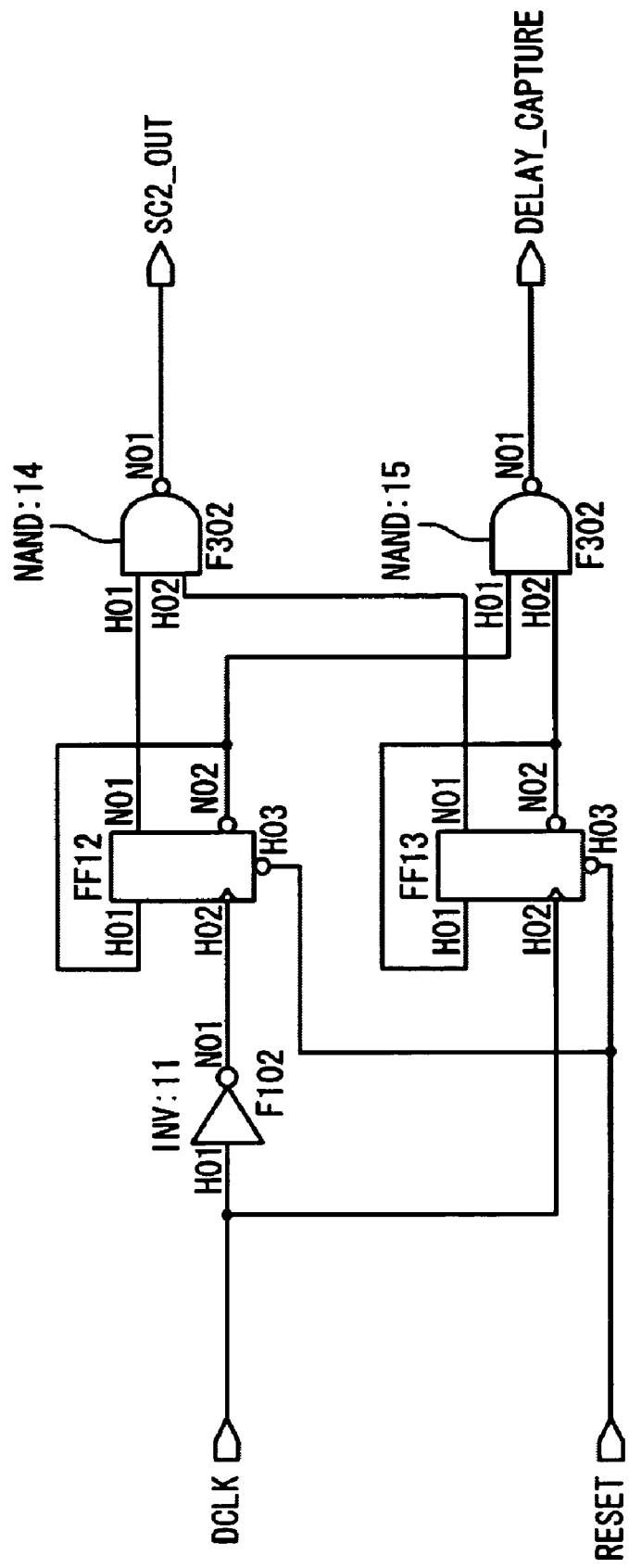
FIG. 5 is a circuit diagram showing an example of a clock signal separating circuit in the present invention.

FIG. 5 is a circuit diagram showing the configuration of the clock signal separating circuit 10 of the present invention. Referring to FIG. 5, the clock signal separating circuit 10 has an inverter INV11, a flip-flop circuit FF12, a flip-flop circuit FF13, a NAND circuit 14 and a NAND circuit 15. The clock signal separating circuit 10 has the DCLK terminal and a RESET terminal as input terminals, and an SC2_OUT terminal and a DELAY_CAPTURE terminal as the output terminals.

The inverter INV11 has an H01 terminal as an input terminal and an N01 terminal as an output terminal, and inverts the signal sent to the H01 terminal and outputs from the N01 terminal. Here, the signal of the high level is inverted into the low level, and the signal of the low level is inverted into the high level. Each of the flip-flop circuit FF12 and the flip-flop circuit FF13 has an H01 terminal and an H02 terminal as the input terminals and an N01 terminal and an N02 terminal as the output terminals. Also, the flip-flop circuit has an H03 terminal for a reset signal input. Each of the NAND circuit 14 and the NAND circuit 15 has an H01 terminal and an H02 terminal as the input terminals and has an N01 terminal as the output terminal.

The clock signal is sent from the DCLK terminal to the H01 terminal of the inverter INV11 and the H02 terminal of the flip-flop circuit FF13. Also, the RESET signal is sent to the H03 terminal of the flip-flop circuit FF12 and the H03 terminal of the flip-flop circuit FF13.

The output clock signal from the N01 terminal of the inverter INV11 is sent to the H02 terminal of the flip-flop circuit FF12. The output clock signal from the N01 terminal of the flip-flop circuit FF12 is sent to the H01 terminal of the NAND circuit 14. The output clock signal from the N02 terminal of the flip-flop circuit FF12 is sent to the H01 terminal of the flip-flop circuit FF12 and the H01 terminal of the NAND circuit 15. The output clock signal from the N01 terminal of the flip-flop circuit FF13 is sent to the H02 terminal of the NAND circuit 14. The output clock signal from the N02 terminal of the flip-flop circuit FF13 is sent to the H01 terminal of the flip-flop circuit FF13 and the H02 terminal of the NAND circuit 15. The output clock signal from the N01 terminal of the NAND circuit 14 becomes the signal that is outputted from the SC2_OUT terminal. Then, the output clock signal from the N01 terminal of the NAND circuit 15 becomes the signal that is outputted from the DELAY_CAPTURE terminal.

In an example in FIG. 5, it is necessary to output the RESET signal once for an initial setting and determine the status of the flip-flop circuits (flip-flop circuit FF12, flip-flop circuit FF13). The signal supplied to the AND circuit 20 is outputted from the SC2_OUT terminal, and the signals inputted to the CLK terminals of the flip-flop circuit FF31, the flip-flop circuit FF32 and the flip-flop circuit FF33 are outputted from the DELAY_CAPTURE terminal.

In the present invention, the clock signal separating circuit 10 is changed from the MUX system to the LSSD system, and the scan shifting operation is changed from the single-phase clock to the two-phase clock. Also, in the present invention, the clock signal separating circuit is used instead of the clock generating circuit in the conventional technique.

In the conventional technique, the clock signal used in the delay test is generated by using the internal circuit. Thus, when the frequency of the clock signal for this delay test is changed, the frequency of the clock signal used for the shifting operation is also changed. However, in the present invention, the delay test clock signal is supplied from the DCLK terminal as the exclusively-used terminal for the delay test. Thus, the frequency of the delay test clock signal can be changed without any influence on the timings of the shift mode.

As mentioned above, according to the present invention, it is possible to easily change the frequency of the delay test without changing the timing of the shift mode. Then, since there is no influence on the shift mode, it is possible to stably execute the delay test. Also, since the delay test signal is the single-phase clock, there is no skew between pins of the tester. Moreover, it is possible to send as high frequency clock signal as 100 MHz or more.

In the circuit in the semiconductor device of the present invention, since the delay test signal is operated under the single clock, the inter-pin skew of the tester is not generated.

What is claimed is:

1. A semiconductor device comprising:
   a clock signal separating circuit configured to separate an external clock signal into a first separation clock signal and a second separation clock signal and to supply said second separation clock signal to a test circuit; and
   a logic circuit configured to generate an output clock signal from said first separation clock signal and a first scan clock signal to said test circuit, wherein a second scan clock signal is supplied to said test circuit.

2. The semiconductor device according to claim 1, wherein said test circuit comprises:
   a first flip-flop circuit configured to operate in response to said second scan clock signal, said second separation clock signal and an output clock signal of said logic circuit;
   a second flip-flop circuit configured to operate in response to an output signal of said first flip-flop circuit, said second scan clock signal, said second separation clock signal and the output clock signal of said logic circuit;

an internal circuit as a test object configured to operate based on an output signal of said second flip-flop circuit; and a third flip-flop circuit configured to operate in response to an output signal of said internal circuit, said second scan clock signal, said second separation clock signal and the output clock signal of said logic circuit.

3. The semiconductor device according to claim 1, wherein said logic circuit comprises;

an AND circuit configured to output the output clock signal as a logical product of said first separation clock signal and said first scan clock signal.

4. The semiconductor device according to claim 1, wherein said clock signal separating circuit sequentially separates said first separation clock signal and said second separation clock signal from said external clock signal in response to each of falling edges of said external clock signal.

5. The semiconductor device according to claim 1, wherein said clock signal separating circuit comprises:

an inverter configured to invert said clock signal;

a fourth flip-flop circuit configured to operate in response to an output clock signal of said inverter, its own first output clock signal and a reset signal;

a fifth flip-flop circuit configured to operate in response to said clock signal, its own first output clock signal and said reset signal;

a first NAND circuit configured to operate in response to a first output clock signal of said fourth flip-flop circuit and a first output clock signal of said fifth flip-flop and to output said first separation clock signal; and a second NAND circuit configured to operate in response to a second output clock signal of said fourth flip-flop circuit and a second output clock signal of said fifth flip-flop circuit and to output a second separation clock signal.

6. The semiconductor device according to claim 1, wherein a scan test is carried out to said semiconductor device, and has:

a first shift mode of said scan test in which said first, second and third flip-flop circuits carry out a shifting operation;

a second shift mode of said scan test in which said first, second and third flip-flop circuits do not carry out the shifting operation;

a capture mode in which a data is taken in said third flip-flop circuit;

a third shift mode in which said first, second and third flip-flop circuits carry out the shifting operation.

* * * * *